US009941236B2

(12) United States Patent
Miwatashi

(10) Patent No.: US 9,941,236 B2
(45) Date of Patent: Apr. 10, 2018

(54) SEMICONDUCTOR DEVICE HAVING WIRE BONDING CONNECTION AND METHOD FOR MANUFACTURING THE SAME

(71) Applicant: Renesas Electronics Corporation, Tokyo (JP)

(72) Inventor: Tadahiro Miwatashi, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/245,298

(22) Filed: Aug. 24, 2016

(65) Prior Publication Data
US 2017/0062313 A1  Mar. 2, 2017

(30) Foreign Application Priority Data
Aug. 28, 2015  (JP) .................. 2015-168534

(51) Int. Cl.
| H01L 23/495 | (2006.01) |
| H01L 23/00 | (2006.01) |
| H01L 23/522 | (2006.01) |
| H01L 23/528 | (2006.01) |
| H01L 23/532 | (2006.01) |

(52) U.S. Cl.
CPC .......... *H01L 24/45* (2013.01); *H01L 23/5226* (2013.01); *H01L 24/05* (2013.01); *H01L 23/4952* (2013.01); *H01L 23/528* (2013.01); *H01L 23/53223* (2013.01); *H01L 2224/04042* (2013.01); *H01L 2224/05624* (2013.01); *H01L 2224/45644* (2013.01)

(58) Field of Classification Search
CPC ... H01L 23/49541; H01L 24/05; H01L 24/45; H01L 2224/04042; H01L 2224/45644; H01L 2224/05624; H01L 23/5226; H01L 23/52223; H01L 23/4952; H01L 23/528; H01L 23/495; H01L 23/00
USPC ......................................... 257/666, 773, 774
See application file for complete search history.

(56) References Cited

U.S. PATENT DOCUMENTS

| 2008/0203577 A1* | 8/2008 | Fukamizu | ............... H01L 24/05 257/773 |
| 2015/0162296 A1* | 6/2015 | Risaki | ..................... H01L 24/05 257/774 |

FOREIGN PATENT DOCUMENTS

JP          2964999 B2     10/1999

* cited by examiner

*Primary Examiner* — Alexander Oscar Williams
(74) *Attorney, Agent, or Firm* — Sughrue Mion, PLLC

(57) ABSTRACT

To prevent cracks of an interlayer insulation film at the time of wire bonding while maintaining adhesion of an aluminum pad electrode and the interlayer insulation film in a semiconductor device in which the aluminum pad electrode and a lead frame are connected with bonding wire by a ball bonding technology. In a bonding pad that is configured to have multiple pad electrodes each with two or more layers, the pad electrodes being electrically connected with one another through vias, the vias are not arranged under an area to which a capillary end of a wire bonder contacts at the time of the wire bonding.

14 Claims, 15 Drawing Sheets

PART C

FORMATION OF FIRST RESIST PATTERN

FORMATION OF SECOND RESIST PATTERN

FORMATION OF VIA HOLE PATTERN

FORMATION OF VIA HOLE (DRY ETCHING)

REMOVAL OF RESIST PATTERN

FORMATION OF VIA AND PAD ELECTRODE

SEMICONDUCTOR DEVICE HAVING WIRE BONDING CONNECTION AND METHOD FOR MANUFACTURING THE SAME

CLAIM OF PRIORITY

The present application claims priority from Japanese Patent application Ser. No. 2015-168534, filed on Aug. 28, 2015, the content of which is hereby incorporated by reference into this application.

BACKGROUND OF THE INVENTION

Filed of the Invention

The present invention relates to a semiconductor device and its manufacturing method, and in particular to a technology that is effective when it is applied to a semiconductor device in which an aluminum pad electrode and a lead frame are connected with bonding wire by a ball bonding technology.

Description of the Related Art

Wire bonding that connects pad electrodes of a semiconductor chip in which an integrated circuit is built and electrodes of a printed circuit board or a semiconductor package using wire such as of gold (Au) and of copper (Cu) has been widely adopted as a mounting technology that features a relatively low cost and a high degree of freedom of wiring.

Meanwhile, with high integration of the semiconductor integrated circuit, pitch narrowing and film thinning of the pad electrode of the semiconductor chip have progressed, improvement of reliability of the wire bonding in miniaturization of the semiconductor integrated circuit has become an issue, because problems of exfoliation of the pad electrode from an interlayer insulation film and a damage of the interlayer insulation film under the pad electrode become remarkable.

There is a technology as described in Patent Document 1 as a background art of this technical field. Patent Document 1 discloses a "semiconductor device that has a pad electrode whose adhesion with an insulation film does not fall by configuring a pad electrode to be a two-layer structure of a first pad electrode and a second electrode and by connecting the first pad electrode and the second electrode with a metal layer (via)."

[Patent Document]

[Patent document 1] Japanese Patent No. 2964999

The above-mentioned Patent Document 1 is such that a pad electrode is formed with a two-layer structure, and this is an effective technology to exfoliation of the pad electrode from an interlayer insulation film. Meanwhile, when performing wire bonding to a semiconductor chip, since an ultrasonic wave is applied to a bonding ball formed in a tip of bonding wire with a fixed load added by a capillary, a large stress is applied to a lower part of the capillary.

With the pad electrode of the two-layer structure in which metal layers (vias) are arranged in a matrix form all over the pad electrode like Patent Document 1, the interlayer insulation film in which a metal layer (vias) located immediately under a location where the bonding ball contacts the capillary end is formed has a problem that cracks easily occur by this stress.

SUMMARY OF THE INVENTION

Other problems and new features will become clear from description and the accompanying drawings of this specification.

According to one embodiment, in a bonding pad that is configured with multiple pad electrodes of two layers or more and so that the pad electrodes are electrically connected through a via, the vias are not arranged under an area to which a capillary end of a wire bonder contacts at the time of the wire bonding.

According to the one embodiment, it is possible to prevent cracks of the interlayer insulation film at the time of the wire bonding while maintaining adhesion of the pad electrode and the interlayer insulation film. Thereby, reliability of the semiconductor device improves.

DETAILED DESCRIPTION OF THE PREFERRED EMBODIMENTS

Figure 1:
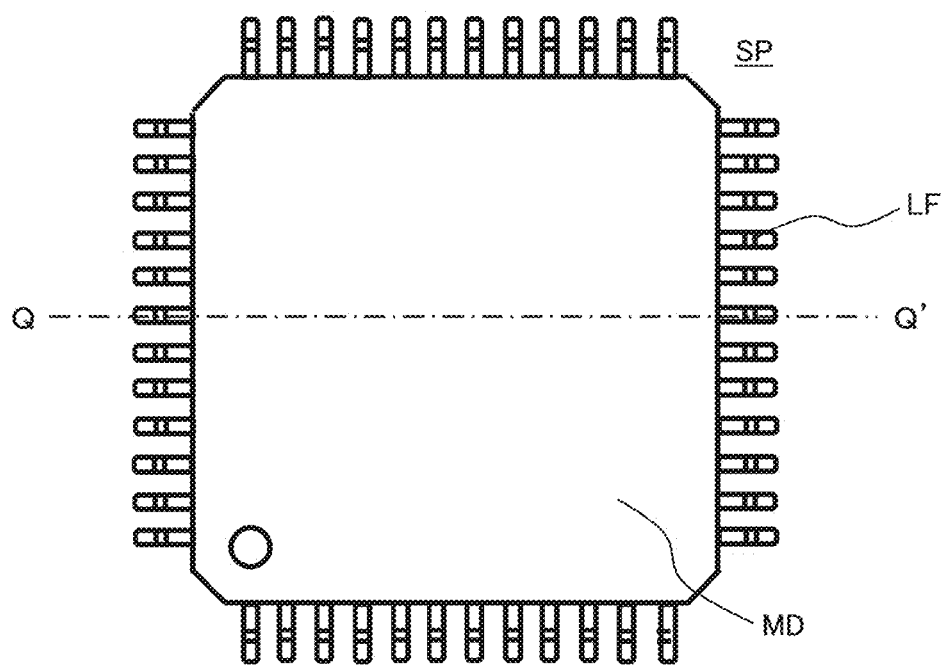
FIG. 1 is a plan view of a semiconductor device according to one embodiment of the present invention.

Hereinafter, examples are described using drawings. Incidentally, the same reference numeral is given to the same constitutional component in each drawing, and for the overlapping portion, its detailed explanation is omitted.

First Embodiment

Figure 16A:
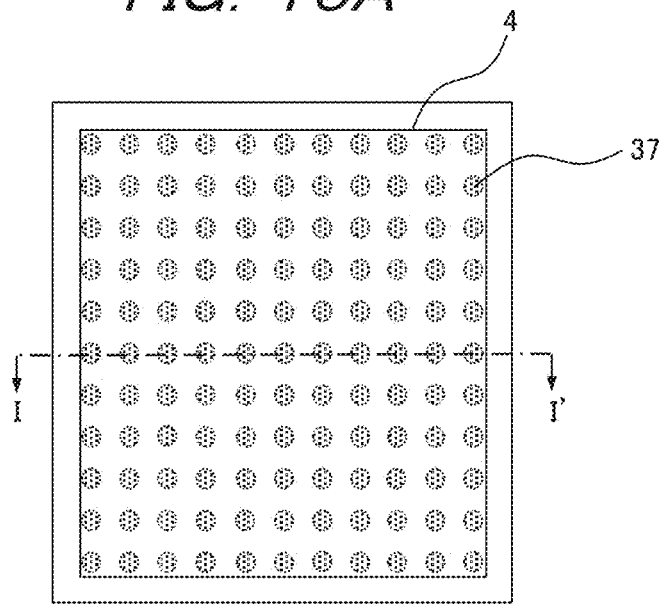
FIG. 16A is an enlarged plan view of the pad electrode portion of the semiconductor device.
Figure 16B:
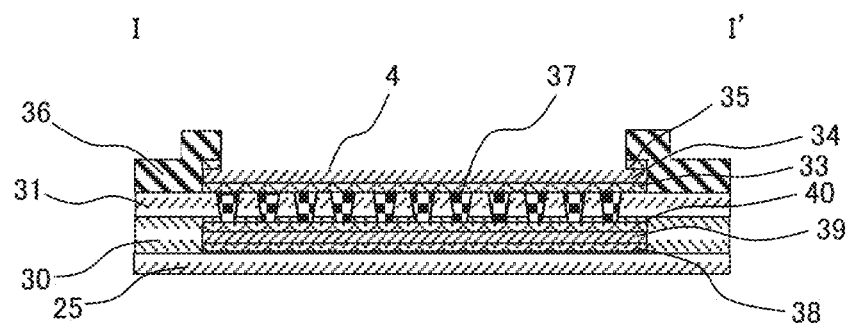
FIG. 16B is a diagram showing a part of a section I-I' of FIG. 16A.

First, problems in the conventional semiconductor device are explained using FIG. 16A to FIG. 17B. FIG. 16A is a plan view of the conventional aluminum pad electrode intended for wire bonding. Moreover, FIG. 16B is a diagram showing a part of a section I-I' of FIG. 16A. As shown in FIG. 16A and FIG. 16B, a pad electrode structure of the conventional semiconductor device is configured with a two-layer structure in which a lower layer pad electrode (a metal layer 39 and barrier metals 38, 40) that is formed on an interlayer insulation film 25 and an upper layer pad electrode (a metal layer 34 and barrier metals 33, 35) that is formed on an interlayer insulation film 31 are electrical connected with multiple vias 37. The multiple vias 37 are what is called dot-shaped vias that are formed in the interlayer insulation films 30, 31 in a matrix form.

An upper layer pad electrode (the metal layer 34 and the upper layer barrier metals 33, 35) is covered with a surface protective film 36, an opening is formed by removing parts of the barrier metal 35 and the surface protective film 36 on the upper layer pad electrode, and a part of the metal layer 34 is exposed to the surface, constituting a pad electrode 4.

Figure 17A:
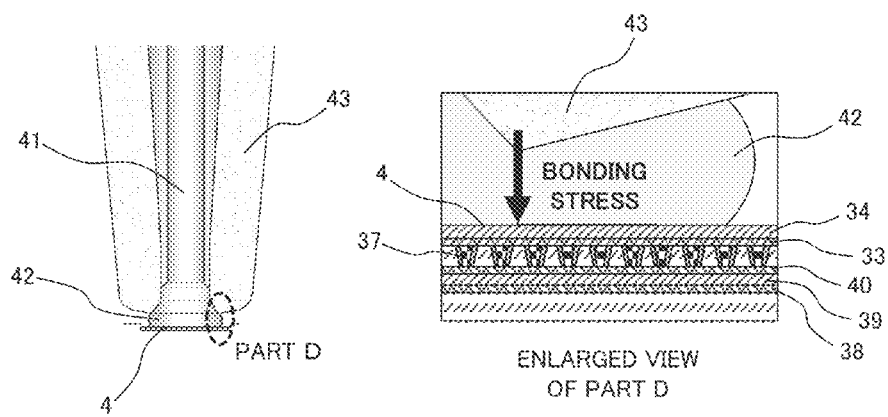
FIG. 17A is a diagram conceptually showing a problem at the time of wire bonding.

FIG. 17A is a diagram showing a stress applied to the pad electrode when the wire bonding is performed to a semiconductor device. The left-hand side of FIG. 17A shows a relative spatial relationship of a capillary 43, bonding wire 41, and a bonding ball 42 of a wire bonder and the pad electrode (bonding pad) 4. Moreover, the right-hand side of FIG. 17A is an enlarged view of a section D.

Figure 17B:
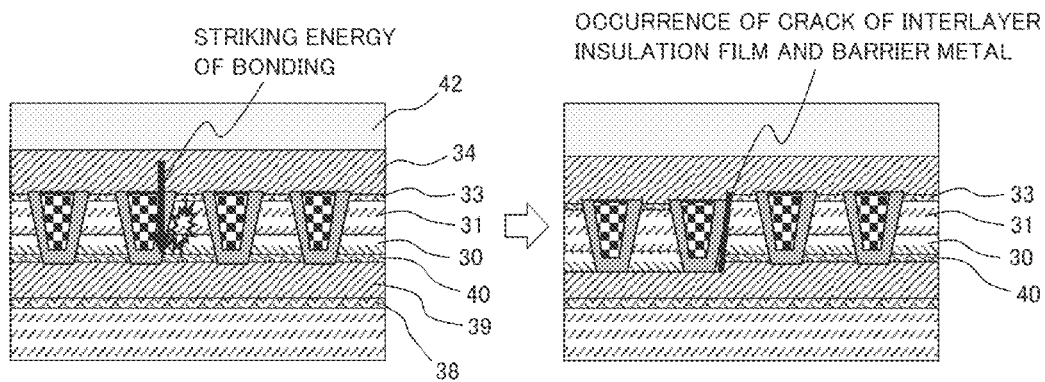
FIG. 17B is a diagram conceptually showing a problem at the time of the wire bonding.

When performing the wire bonding, the bonding wire 41 and the pad electrode (bonding pad) 4 are joined with an ultrasonic wave applied to the bonding ball 42 formed in a tip of the bonding wire 41 with a predetermined load added thereto through the capillary. At this time, a large stress is applied to a lower part of the capillary 43, especially to a tip of the capillary 43. As a result, as shown in FIG. 17B, there occurs a problem that this stress generates cracks in the interlayer insulation films 30, 31 and the barrier metals 33, 40.

Figure 2:
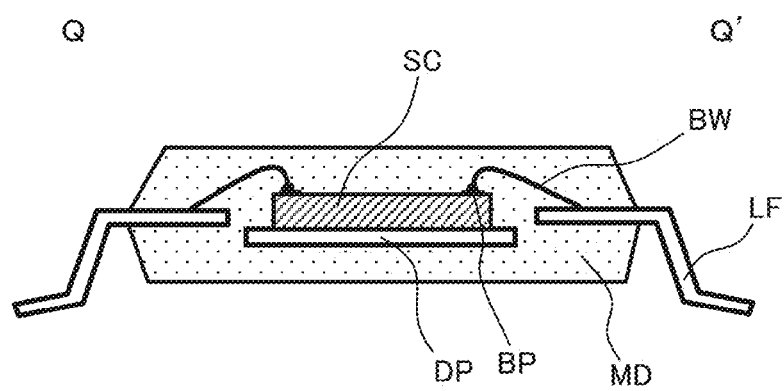
FIG. 2 is a Q-Q' sectional view of FIG. 1.

A semiconductor package of this example is explained using FIG. 1 and FIG. 2. FIG. 1 is a plan view of the semiconductor package of this example, and FIG. 2 shows a section Q-Q' of FIG. 1. Incidentally, in this example, although the semiconductor package is explained mainly using an example of QFP (Quad Flat Package), this is just an illustration and a form of the package is not limited to this.

A semiconductor package SP of this example is such that lead frames LF are taken out from four sides of the package and is a package that is formed into a gull wing shape, being a type called QFP, as shown in FIG. 1. The package body is formed by a mold MD. For materials of the mold MD, there are a ceramic package that seals the ceramic with an epoxy resin, a package formed by injection molding a melted plastic, etc.

An internal structure of the semiconductor package SP takes a structure where a semiconductor chip SC, a die pad DP for supporting and fixing the semiconductor chip SC, and a part of the lead frame LF that is called an inner lead are sealed with the mold MD, as shown in FIG. 2. A bonding pad (pad electrode) BP and the lead frame LF that were provided on the principal plane side of the semiconductor chip SC are electrically connected with the bonding wire BW.

Figure 3:
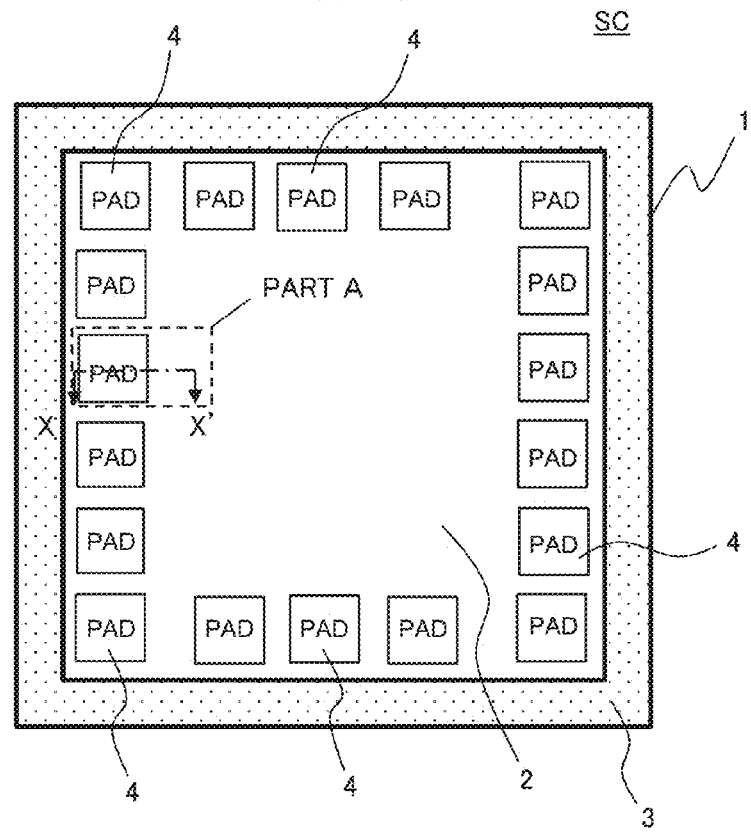
FIG. 3 is a plan view of a semiconductor chip according to the one embodiment of the present invention.
Figure 4:
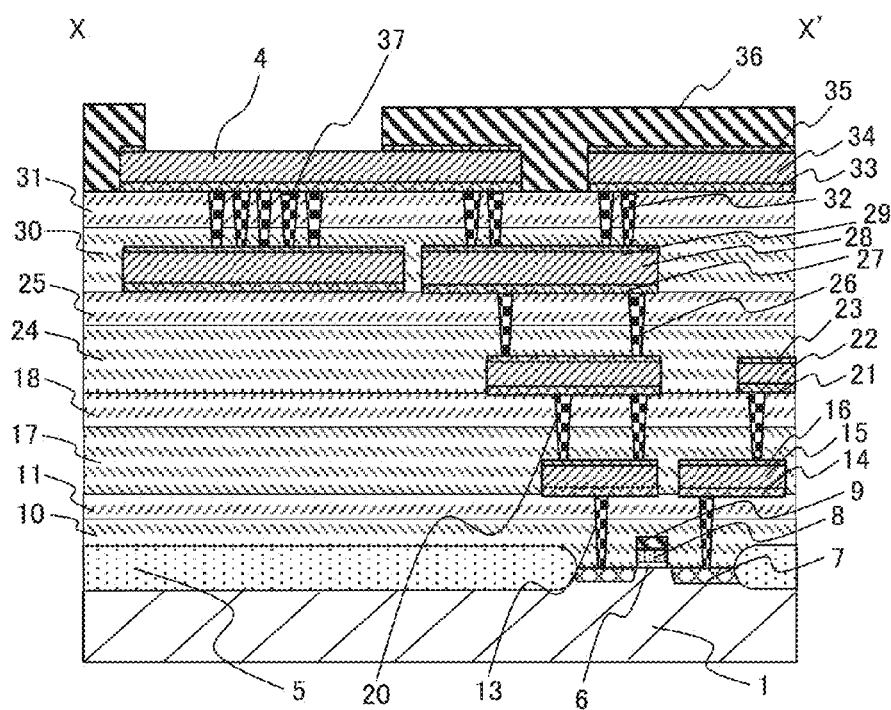
FIG. 4 is an X-X' sectional view of a part A of FIG. 3.
Figure 5:
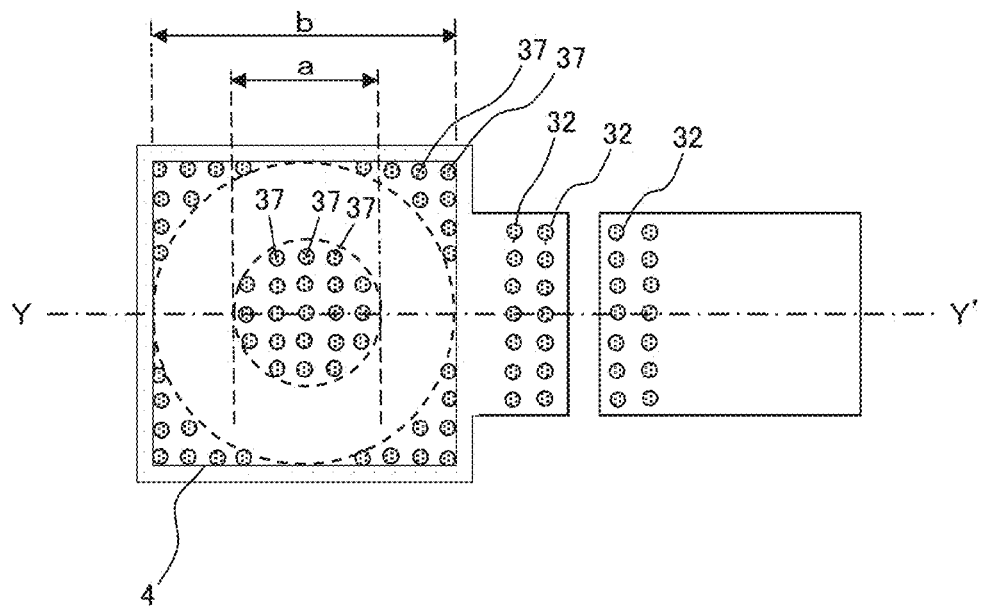
FIG. 5 is an enlarged plan view of a pad electrode portion of the semiconductor device according to the one embodiment of the present invention.
Figure 6:
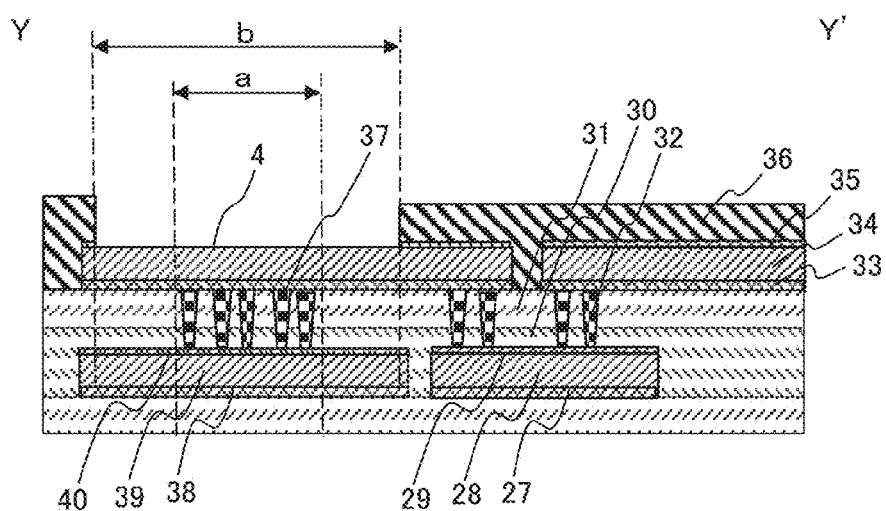
FIG. 6 is a diagram showing a part of a section Y-Y' of FIG. 5.

Next, the semiconductor chip SC and the bonding pad (pad electrode) BP of FIG. 2 are explained using FIG. 3 to FIG. 6. FIG. 3 is a plan view of the semiconductor chip SC, and FIG. 4 shows a section X-X' in a part A of FIG. 3. FIG. 5 is an enlarged plan view of the part A of FIG. 3, and FIG. 6 is a diagram showing a part of a section Y-Y' of FIG. 5.

As shown in FIG. 3, on a surface of the semiconductor substrate 1 of which the semiconductor chip SC is comprised, an element formation area 2 covered with a surface protective film (passivation film) that is not illustrated and its periphery area 3 are provided. A MOS transistor etc. are formed in the element formation area 2, and the pad (PAD) electrode 4 electrically connected with them is provided as an external terminal. This pad electrode 4 (pad electrode BP) is electrically connected with the lead frame LF by the bonding wire BW, as shown in FIG. 2.

FIG. 4 shows a surrounding structure (section) of the pad electrode 4. On the semiconductor substrate 1, four layers in a four-layer metal wiring layer such that metal layers 15, 22, 28, and 34 each essentially consisting of aluminum (Al) are sandwiched by barrier metals 14, 16, 21, 23, 27, 29, 33, and 35 each including, for example, titanium (Ti), titanium nitride (TiN), etc. at their upper and lower sides are laminated through interlayer insulation films 10, 11, 17, 18, 24, 25, 30, and 31, respectively. The four metal wiring layers are electrically connected by vias 20, 26, 32, and 37, respectively.

Incidentally, on a principal plane of the semiconductor substrate 1, the silicon oxide film 5 that is an element isolation layer is formed, and various elements, such as a transistor that includes a gate oxide 6, a diffusion layer 7, a polysilicon film 8, and a tungsten silicide (WSi) film 9, are formed in the element formation area 2 of the semiconductor substrate 1. Moreover, the diffusion layer 7 is electrically connected with the metal wiring layers (the metal layer 15 and the barrier metal 14, 16) that are bottom layers by a via 13.

The pad electrode 4 is provided in a part of the metal layer 34 that is an uppermost layer. Parts of the metal layer 34 and the pad electrode 4 that are the uppermost layers are covered with the surface protective film 36. Moreover, the pad electrode 4 has a structure such that the opening is formed thereon and the surface of the metal layer 34 is exposed by removing parts of the barrier metal 35 on the top of the metal wiring layer being the uppermost layer and the surface protective film 36. This pad electrode 4 is used for connection (contact) of a test needle at the time of a wafer probing test and as a junction of the bonding wire at the time of the wire bonding.

In the bonding pad (pad electrode) structure of this example, as is shown in FIG. 4, the via 37 (via for protection) is selectively formed under the pad electrode 4 in order to increase adhesion strength of ball bonding connection. That is, the vias 37 are not provided all over under the pad electrode 4, but an area under it is divided into an area (via arrangement area) in which the vias 37 are arranged and an area (via inhibition area) in which the vias 37 are not arranged, and the vias 37 are selectively provided in the former.

Incidentally, the vias 13, 20, 26, and 32 for circuit to be provided in the element formation area 2 and the via 37 for protection to be provided under the above-mentioned pad electrode 4 are formed by embedding a high melting point metal such as tungsten (W), for example, in an inside of the opening hole formed in the interlayer insulation film via the barrier metal.

With reference to FIG. 5 and FIG. 6, a configuration of the pad electrode 4 is explained in more detail. Under an area sandwiched by a virtual circle of a diameter b inscribed in a rectangular opening formed in the surface protective film 36 on the pad electrode 4 and a virtual circle of a diameter a derived on the basis of a dimension of a wire diameter of the ball bonding, arrangement of the via 37 for protection is inhibited in order to prevent the cracks that occur at the time of the ball bonding. That is, the via 37 is not provided under the area sandwiched by the virtual circle of the diameter b and the virtual circle of the diameter a.

Incidentally, in the pad structure of FIG. 5 and FIG. 6, film thicknesses of the uppermost metal layer 34 essentially consisting of aluminum (Al) and the metal layer 39 arranged immediately under it are specified to be 600 nm, and the vias 37 for protection are specified to have a via diameter of 560 nm and an inter-via distance of 660 nm and are arranged in a matrix form. Moreover, the opening dimension b of the surface protective film 36 on the pad electrode is 80 μm, wire of a wire diameter of 30 μm is used for the bonding wire, and manufacturing conditions are set so that a ball diameter MBD (Mashed Ball Diameter) of the bonding ball may become 68 μm. At this time, the dimension a that defines the inhibition area in which the via 37 is not arranged is set to 38 μm larger than the wire diameter by 8 μm.

Figure 7:
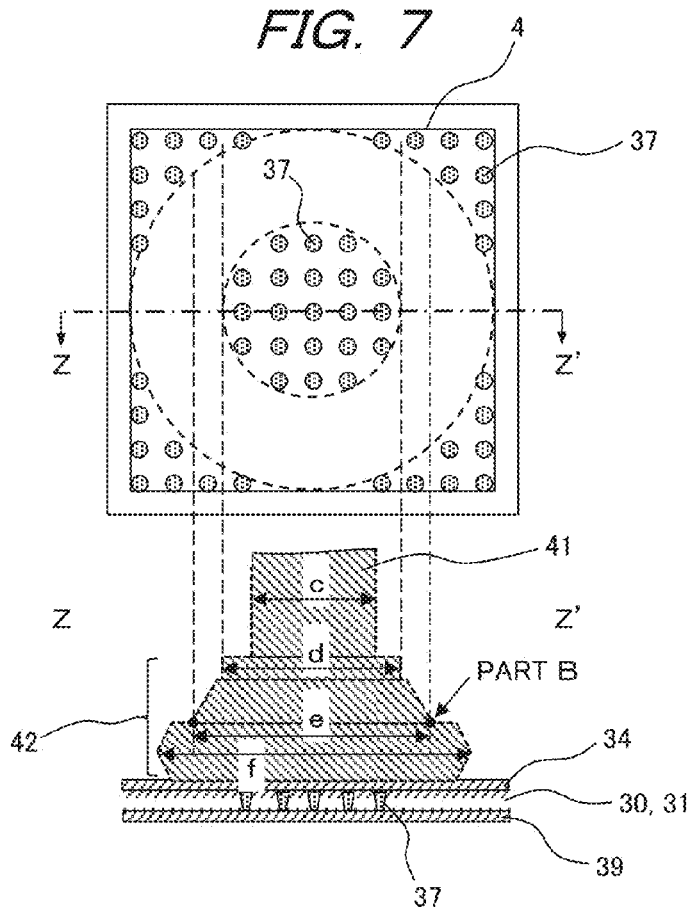
FIG. 7 is a diagram conceptually showing junction of a pad electrode and bonding wire according to the one embodiment of the present invention.
Figure 8:
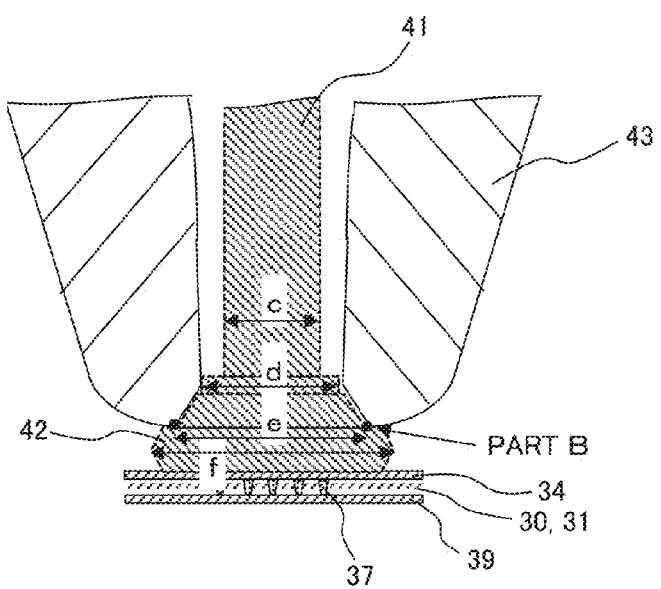
FIG. 8 is a diagram showing the bonding wire and a capillary according to the one embodiment of the present invention.

FIG. 7 conceptually shows a spatial relationship of the pad electrode and the bonding wire that is joined to the pad electrode. Moreover, FIG. 8 conceptually shows a spatial relationship of the pad electrode, the bonding wire, and the capillary of the wire bonder at the time of the wire bonding.

A portion of the bonding ball 42 at which the end of the capillary 43 hits it, namely a capillary mark (a portion B in FIG. 7 and FIG. 8) becomes circular when seeing it from the top side, and this depends on a shape of the capillary 43. This capillary mark is a dent of a chamfer part of the capillary 43 formed on the bonding ball 42 at the time of the wire bonding. In the capillary 43, a diameter (e of FIG. 7 and FIG. 8) of this circle is called a chamfer diameter. Moreover, a cylinder inner diameter (d of FIG. 7 and FIG. 8) of the long and slender capillary 43 through which wire is made to pass is called a hole diameter. The chamfer diameter e is smaller than the mashed ball diameter MBD (f of FIG. 7 and FIG. 8) and larger than the hole diameter d. Since the mashed ball diameter f is set to be within the inside of the pad opening even when considering position shift of the wire bonding, it is smaller than a pad opening dimension.

The hole diameter d of the capillary 43 is set so that the bonding wire 41 can be formed with an ideal loop, and is set to be wider than the wire diameter (c of FIG. 7 and FIG. 8) in a range of not less than 5 μm and not more than 13 μm.

As is clear from the above, when performing bonding so that a center of the bonding ball 42 may agree with a center of the pad electrode, there exists a virtual circle such that the capillary end is located in the area sandwiched by the virtual circle of a diameter that is larger than a wire diameter c by 5 μm to 13 μm and the virtual circle inscribed in the pad opening. In this example, the area sandwiched by these two circles, namely the virtual circle of a diameter larger than the wire diameter c by 5 μm to 13 μm and the virtual circle inscribed in the pad opening, is set as the inhibition area of via arrangement, and thereby occurrence of the clacks in the vicinity of the via by the stress of the capillary end is prevented.

Figure 9:
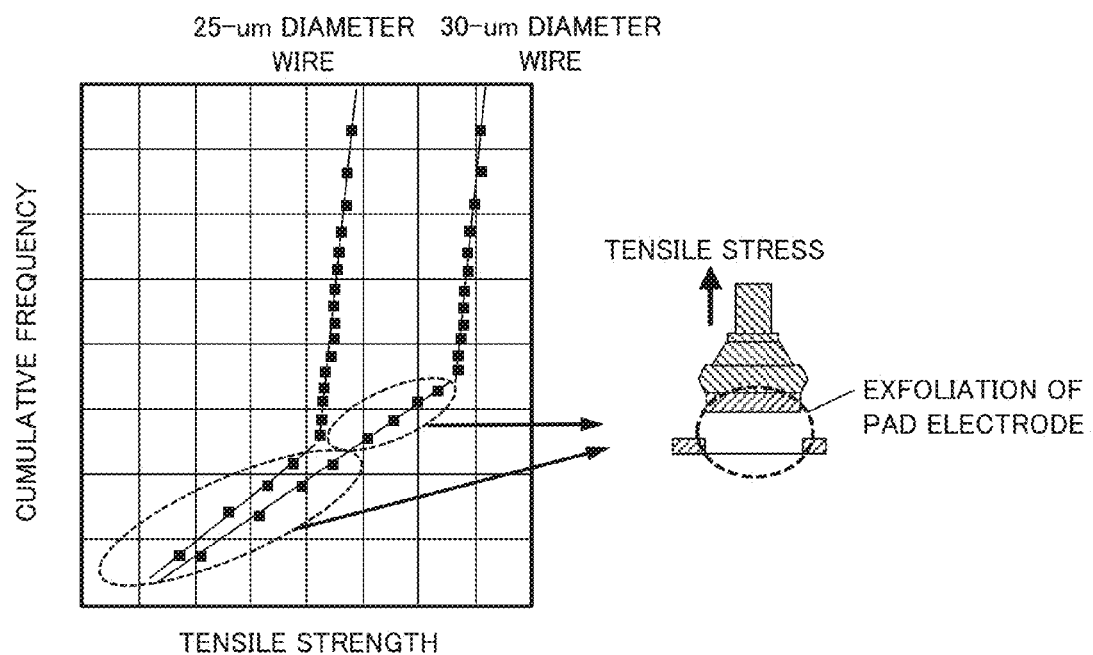
FIG. 9 is a graph showing a wire tension test result in a single-layer pad electrode whose thickness is thin.
Figure 10:
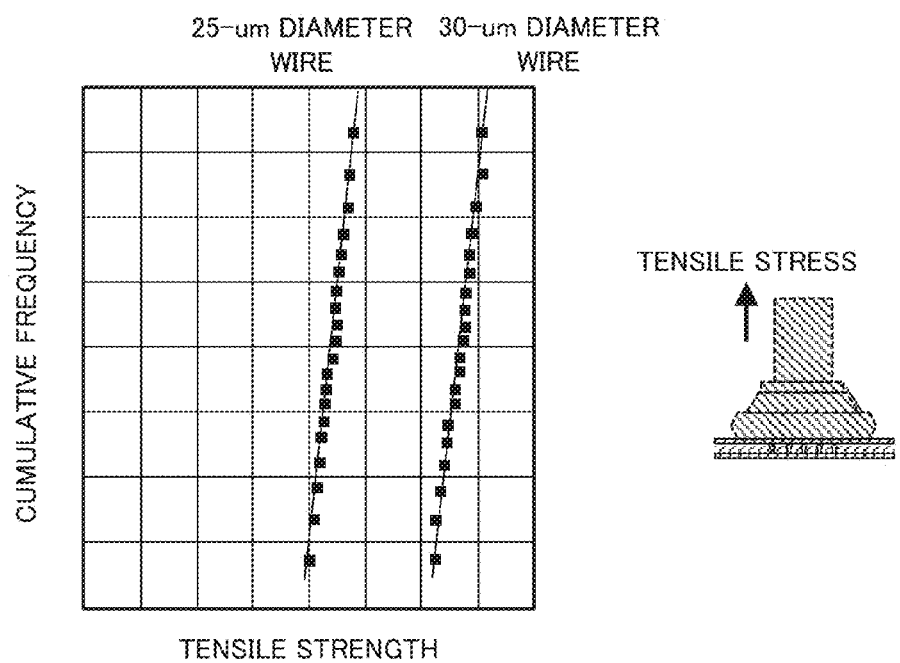
FIG. 10 is a graph showing the wire tension test result in a pad electrode according to the one embodiment of the present invention.

An effect of this example is explained using FIG. 9 and FIG. 10. FIG. 9 shows a result of a wire tension test with a thin single-layer pad electrode structure whose film thickness is thin. FIG. 10 shows a result of a wire tension test with the pad electrode structure of this example. Incidentally, in order to show that the test result is not dependent on the wire diameter, the same tests were carried out using wire of a diameter of 25 μm and wire of a diameter of 30 μm, respectively. A conventional pad electrode used for the test of FIG. 9 is one such that a pad electrode is formed of only one layer and a film thickness of aluminum (Al) of the pad electrode is thinned.

With the single-layer pad electrode structure whose film thickness is thin, as shown in FIG. 9, it is found that since alloying of gold (Au) that is a material of the bonding wire and aluminum (Al) that is a material of the pad electrode proceeds as far as a portion under the pad electrode, the pad electrode easily exfoliates from the interlayer insulation film even when a ball diameter is small with a relatively low tension stress.

In contrast, with the pad electrode structure of this example, as shown in FIG. 10, it is found that the adhesion strength is reinforced by the via arranged directly under the bonding wire, and it is difficult for the pad electrode to exfoliate from the interlayer insulation film.

Therefore, by the pad electrode structure of this example, it is possible to prevent the cracks of the interlayer insulation film at the time of the wire bonding while maintaining the adhesion of the pad electrode and the interlayer insulation film. Thereby, reliability of the semiconductor device improves. In particular, it is more suitable for the semiconductor device that is required to have high reliability over a long period like a semiconductor product for vehicle.

With reference to FIG. 11A to FIG. 11J, the method for manufacturing a semiconductor device that has the pad electrode structure of this example is explained sequentially.

Figure 11A:
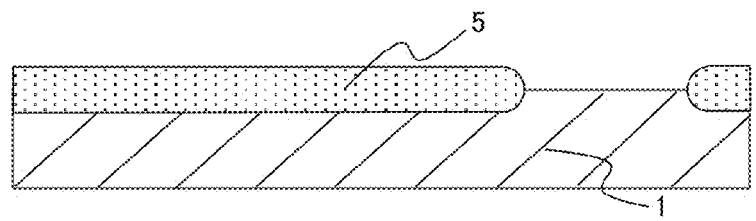
FIG. 11A is a sectional view showing a part of a manufacturing process according to the one embodiment of the present invention.

First, as shown in FIG. 11A, the silicon oxide film 5 is selectively formed on the principal plane of the semiconductor substrate 1 that is a silicon (Si) wafer, for example, by a LOCOS method. The silicon oxide film 5 serves as the element isolation layer of various elements formed on the principal plane of the semiconductor substrate 1.

Figure 11B:
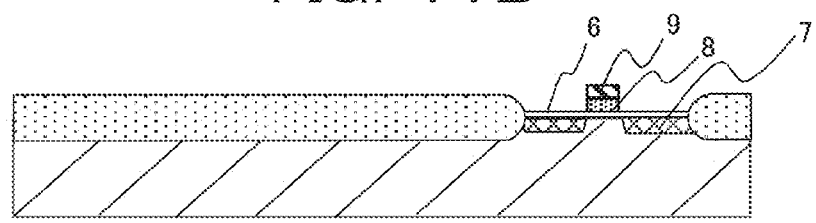
FIG. 11B is a sectional view showing a part of the manufacturing process according to the one embodiment of the present invention.

Next, as shown in FIG. 11B, the gate oxide 6 is formed by thermal oxidation, and the polysilicon film 8 and the tungsten silicide (WSi) film 9 are patterned by the photolithography technology and the dry etching technology such as RIE (Reactive Ion Etching) to form a gate oxide film and a gate electrode of a MOS transistor. Furthermore, the diffusion layer 7 is formed by an ion implantation method in self alignment in which the gate electrode including the polysilicon film 8 and the tungsten silicide (WSi) film 9 and the silicon oxide film 5 that is the element isolation layer are used as a mask. This diffusion layer 7 becomes a source and a drain of the MOS transistor.

Figure 11C:
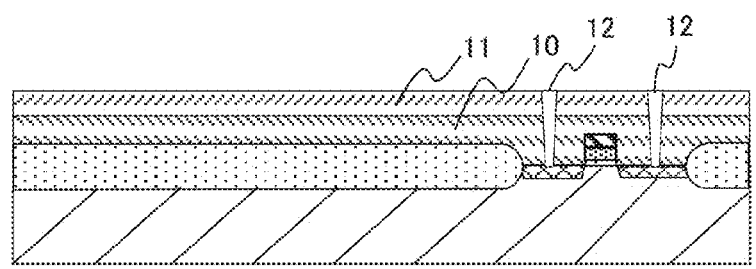
FIG. 11C is a sectional view showing a part of the manufacturing process according to the one embodiment of the present invention.

Then, as shown in FIG. 11C, the interlayer insulation film 10 including, for example, a BPSG (Boron Phosphorus Silicate Glass) film is formed by a CVD (Chemical Vapor Deposition) method. Then, the interlayer insulation film 10 is flattened by a CMP technology (Chemical Mechanical Planarization) etc., and another interlayer insulation film 11, for example, a silicon oxide film ($SiO_2$ film) is formed on the interlayer insulation film 10 by the CVD method. An opening hole 12 for establishing electrical connection with the diffusion layer 7 and the gate electrode is formed in the interlayer insulation films 10, 11 by the photolithography technology and the dry etching technology such as RIE.

Figure 11D:
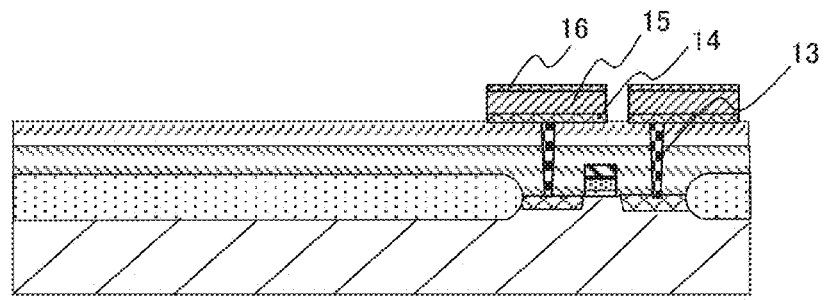
FIG. 11D is a sectional view showing a part of the manufacturing process according to the one embodiment of the present invention.

Next, as shown in FIG. 11D, the inside of the opening hole 12 formed in the interlayer insulation films 10, 11 is embedded with a barrier metal, and a high melting point metal such as tungsten (W), for example, by a CVD method, and the embedded opening hole 12 is flattened by an etch back technology of dry etching or the CMP technology to form the via 13. Then, the metal layer 15 essentially consisting of aluminum (Al), the barrier metal 14 under it, and the barrier metal 16 over it are formed by a PVD (Physical Vapor Deposition) method etc., and are patterned by the photolithography technology and the dry etching technology such as RIE to form metal wiring.

Figure 11E:
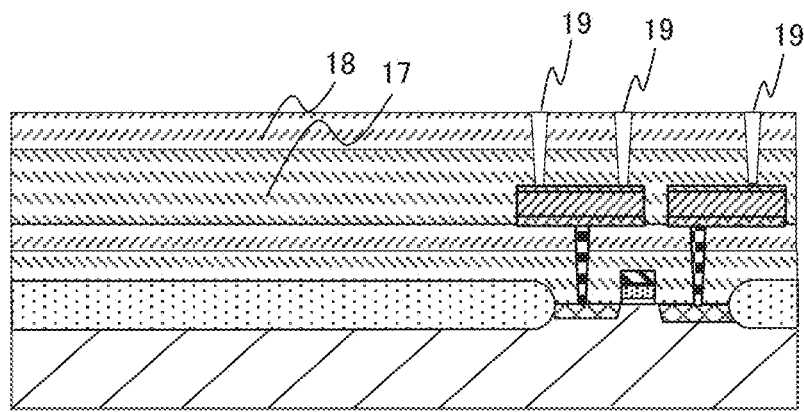
FIG. 11E is a sectional view showing a part of the manufacturing process according to the one embodiment of the present invention.

After this, as shown in FIG. 11E, the interlayer insulation film 17, for example, silicon oxide film ($SiO_2$ film) etc., is formed by a HDP-CVD (High-Density Plasma CVD) method, and subsequently is flattened, and the interlayer insulation film 18, for example, a silicon oxide film ($SiO_2$ film) etc., is formed on the interlayer insulation film 17 by a plasma CVD method. An opening hole 19 for connecting the interlayer insulation films 17, 18 with the wiring layer (metal layer 15) that is a lower layer is formed by the photolithography technology and the dry etching technology such as RIE.

Figure 11F:
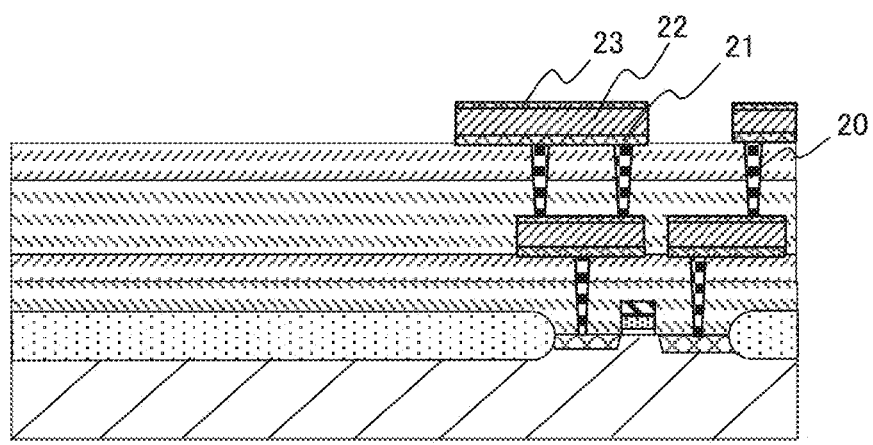
FIG. 11F is a sectional view showing a part of the manufacturing process according to the one embodiment of the present invention.

Next, as shown in FIG. 11F, the opening hole 19 formed in the interlayer insulation films 17, 18 is embedded with the barrier metal and a high melting point metal such as tungsten (W), for example, via the barrier metal by a CVD method, and the embedded opening hole 19 is flattened by the etch back technology of dry etching or the CMP technology to form the via 20. Subsequently, the metal layer 22 essentially consisting of aluminum (Al), the barrier metal 21 under it, and the barrier metal 23 over it are formed by the PVD method etc., and is patterned by the photolithography technology and the dry etching technology such as RIE.

Figure 11G:
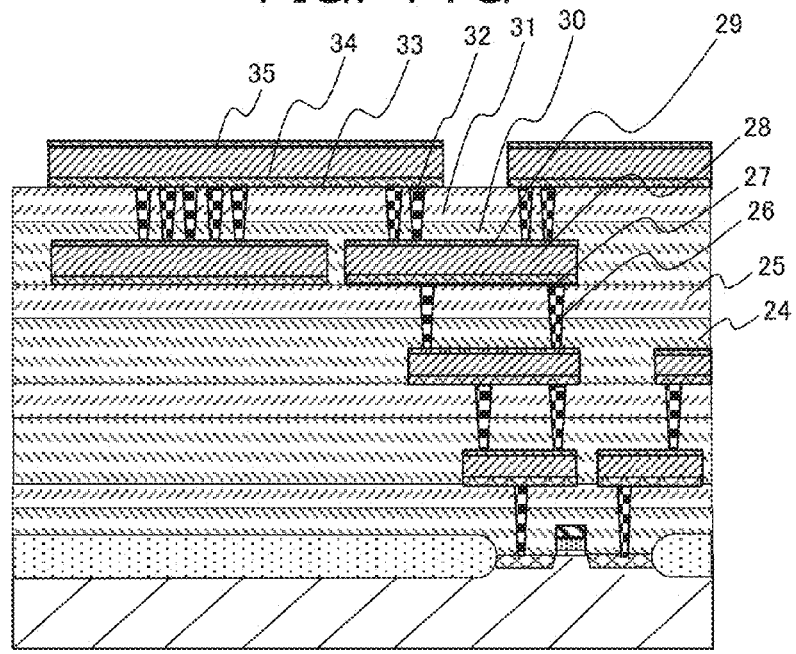
FIG. 11G is a sectional view showing a part of the manufacturing process according to the one embodiment of the present invention.

By a method similar to the above method, as shown in FIG. 11G, the interlayer insulation films 24, 25 and the via 26 are formed, the metal layer 28 essentially consisting of aluminum (Al), the barrier metal 27 under it, and the barrier metal 29 over it are formed by the PVD method etc., and is patterned by the photolithography technology and the dry etching technology such as RIE. Furthermore, the interlayer insulation films 30, 31 and the via 32 are formed, and the metal layer 34 essentially consisting of aluminum (Al), the barrier metal 33 under it, and the barrier metal 35 over it are patterned simultaneously.

Figure 11H:
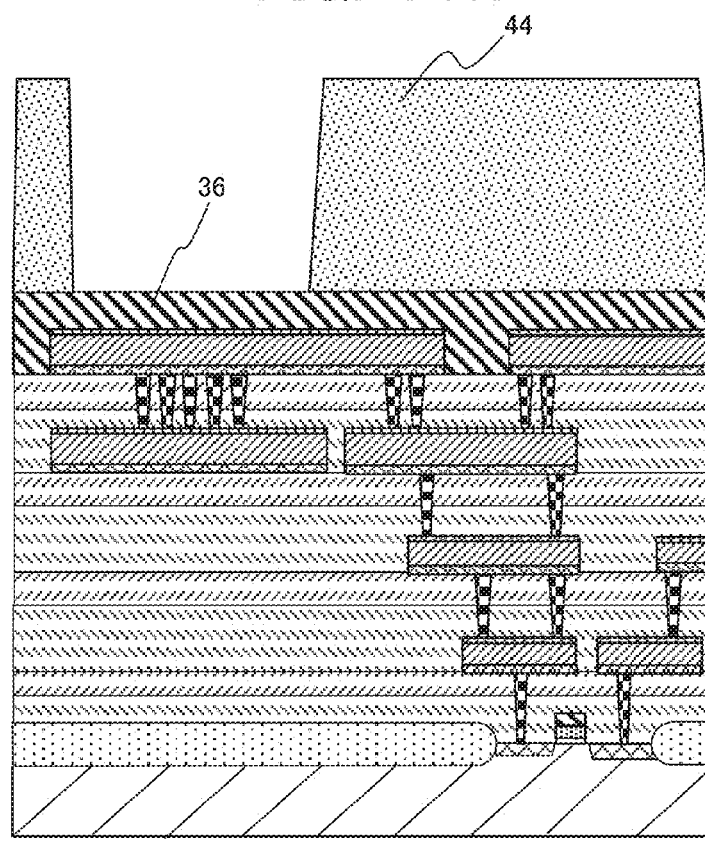
FIG. 11H is a sectional view showing a part of the manufacturing process according to the one embodiment of the present invention.

Subsequently, as shown in FIG. 11H, the surface protective film 36 such as a polyimide resin, for example, is formed on the wiring layer 34 that is an uppermost layer; and a photoresist film 44 is applied to it, and is patterned by the photolithography technology.

Figure 11I:
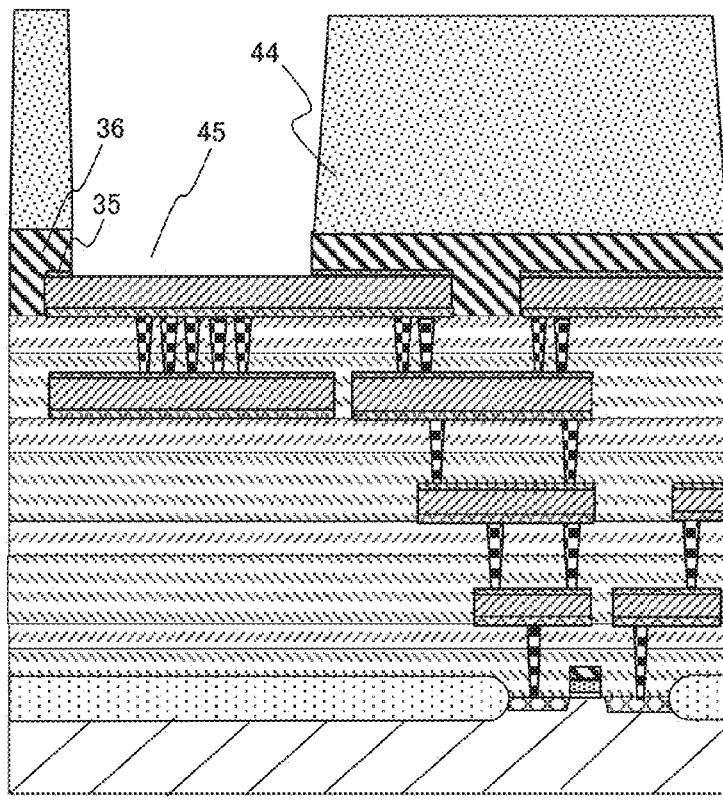
FIG. 11I is a sectional view showing a part of the manufacturing process according to the one embodiment of the present invention.

Then, as shown in FIG. 11I, the surface protective film 36 and the barrier metal 35 over it are dry etched by using the photoresist film 44 as a mask to form a pad opening 45.

Figure 11J:
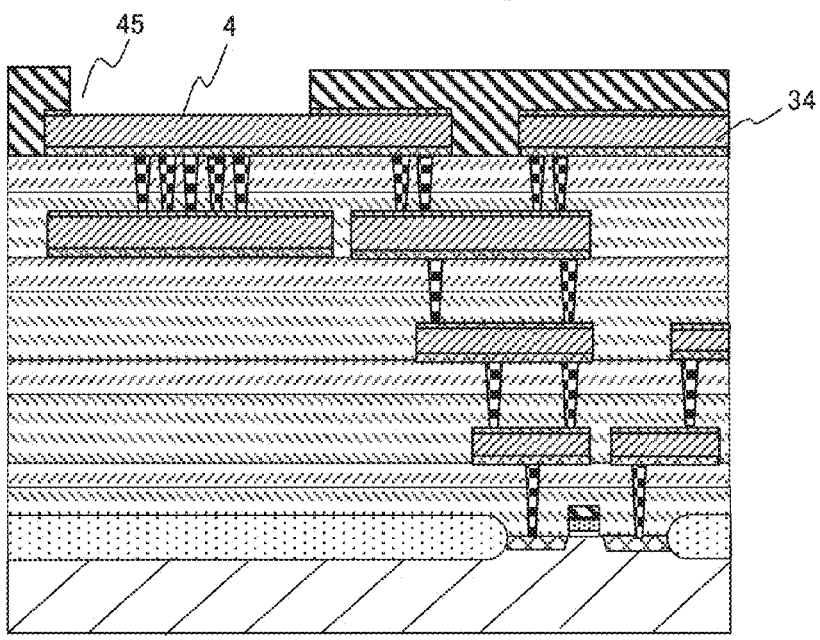
FIG. 11J is a sectional view showing a part of the manufacturing process according to the one embodiment of the present invention.

Lastly, as shown in FIG. 11J, by removing the photoresist film 44 by asking with oxygen ($O_2$) plasma, a part of the surface of the wiring layer 34 that is the uppermost layer is exposed from the pad opening 45 to form the pad electrode 4. By the above, the semiconductor device of this example shown in FIG. 3 and FIG. 4 is completed.

Figure 12:
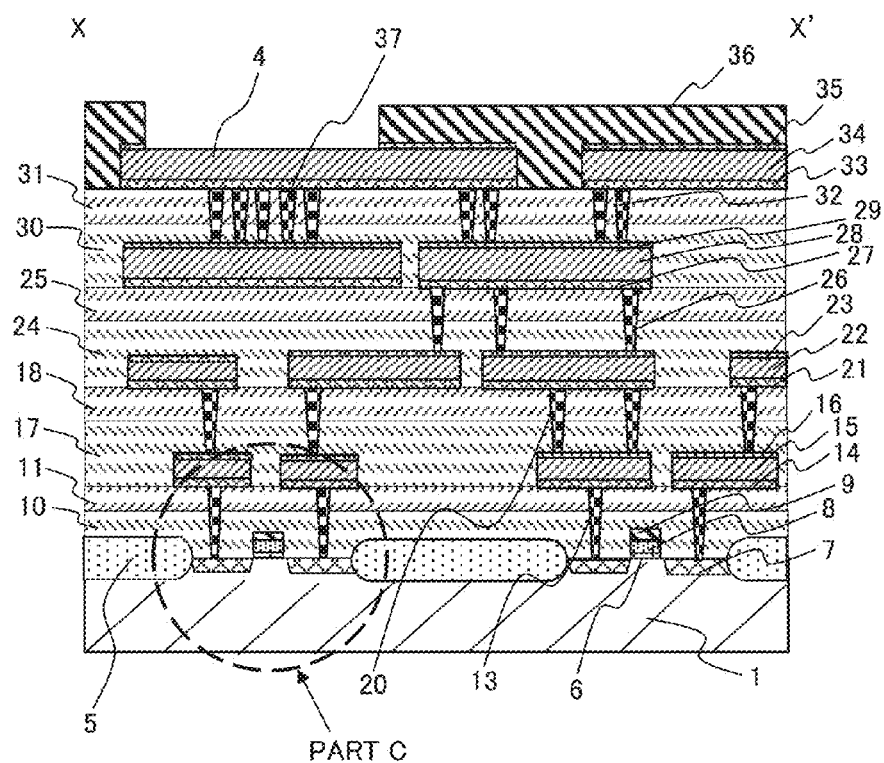
FIG. 12 is a modification of FIG. 4.

FIG. 12 shows a modification of the semiconductor device of this example. FIG. 12 shows the section X-X' in the part A of FIG. 3 like FIG. 4. The semiconductor device shown in FIG. 12 is different from the semiconductor device of FIG. 4 in a respect that elements such as a MOS transistor are formed in an area of a part C shown by a broken line circle, i.e., an area that is a lower layer of the pad electrode 4.

In the conventional semiconductor device, since the cracks occur in the interlayer insulation film that is under the pad electrode 4, semiconductor devices such as a MOS transistor cannot be provided in an area that is lower than the pad electrode 4. However, in the pad electrode structure of this example that can prevent occurrence of the cracks of the interlayer insulation film, it is possible to arrange a semiconductor device under the pad electrode 4. This has an effect of suppressing expansion of a chip size of a semiconductor device with a large number of pad electrodes.

Second Example

Figure 13A:
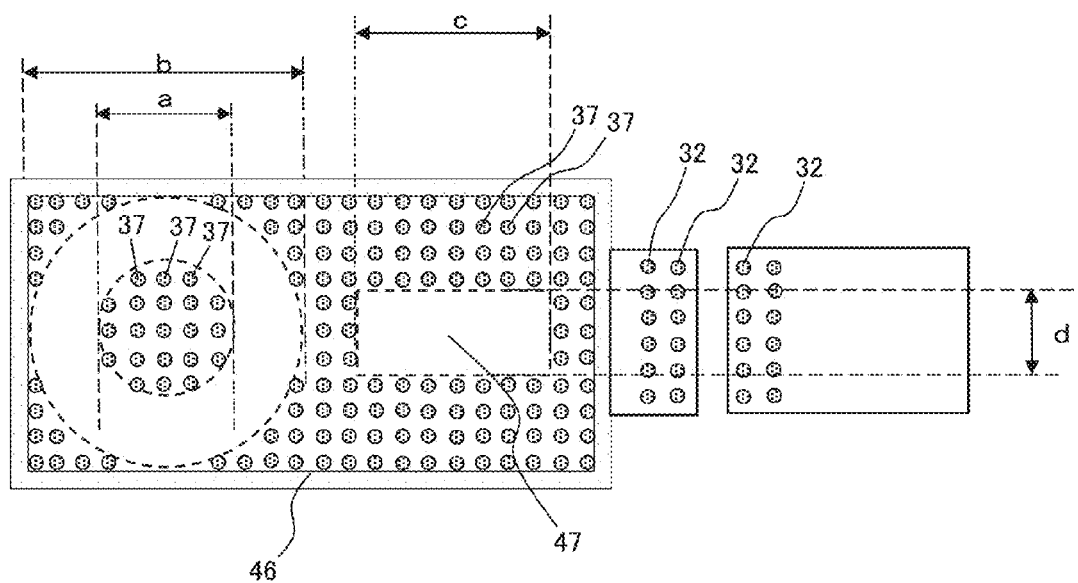
FIG. 13A is an enlarged plan view of the pad electrode portion of the semiconductor device according to the one embodiment of the present invention.
Figure 13B:
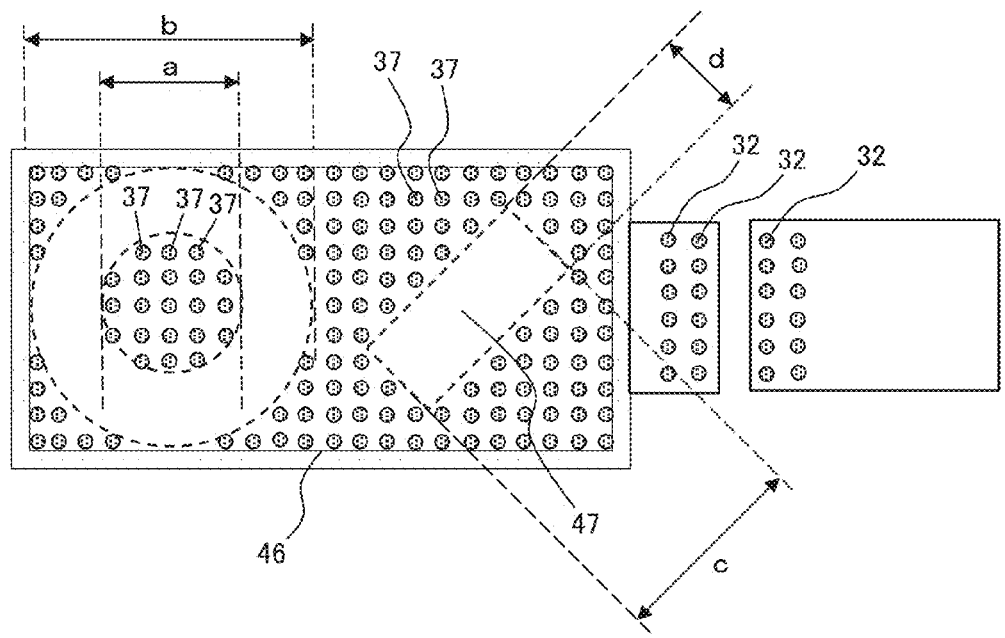
FIG. 13B is a modification of FIG. 13A.
Figure 14A:
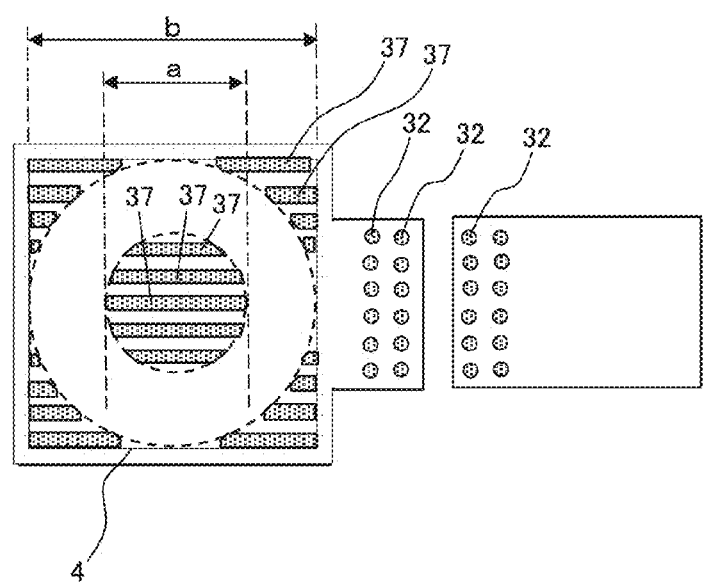
FIG. 14A is a modification of FIG. 5.
Figure 14B:
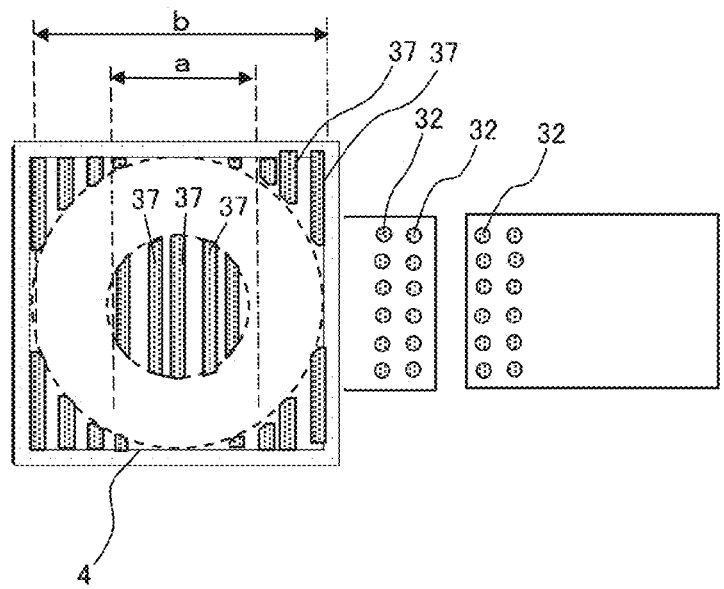
FIG. 14B is another modification of FIG. 5.
Figure 14C:
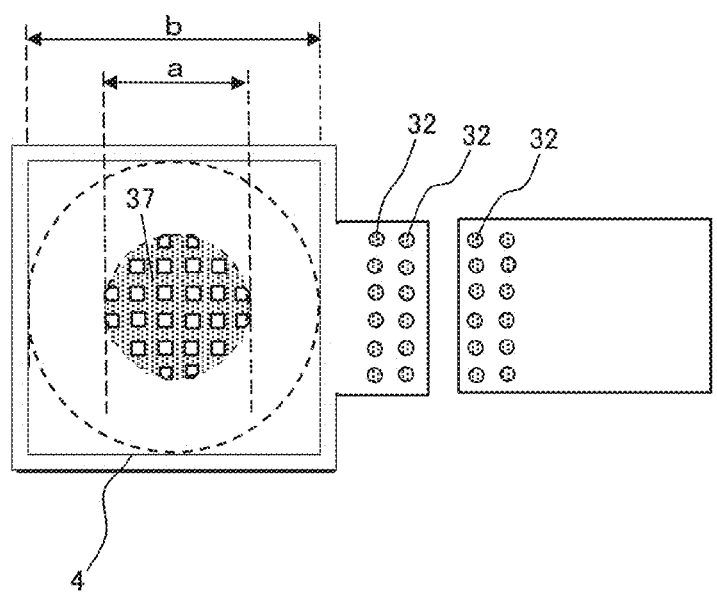
FIG. 14C is further another modification of FIG. 5.

A bonding pad (pad electrode) BP in a second example is explained using FIG. 13A to FIG. 14C. FIG. 13A is an enlarged plan view of the part A of FIG. 3 like FIG. 5. Moreover, FIG. 13B shows a modification of FIG. 13A. FIG. 14A to FIG. 14C are enlarged plan views of the part A of FIG. 3, like FIG. 5, which are modifications of FIG. 5, respectively.

Comparing and referring to FIG. 13A and FIG. 5, while the pad electrode 4 of FIG. 5 is a substantially square, a pad electrode 46 of FIG. 13A is a rectangle, and is different from the former in a respect that the latter is increased in area of the pad electrode. That is, an area (probing area 47) to which the test needle (probe) contacts at the time of the wafer probing test is provided independently and separately from the position of the ball that performs wire bonding connection, so that a contact mark (probe mark) that is generated at the time of probing may not affect the wire bonding.

Although an area of the pad electrode becomes large as compared with the pad electrode of FIG. 5, increase of chip area can be suppressed, for example, by arranging the semiconductor device under the pad electrode as shown in FIG. 12.

In order to prevent the cracks of the interlayer insulation film, arrangement of the via 37 is inhibited under the pad electrode at a position where contact of the test needle (probe) is assumed at the time of the wafer probing test. Incidentally, in the pad electrode 46 of FIG. 13A, the contact area of the test needle (probe) and the pad that is 20 μm wide and 40 μm long is needed supposing suitable over drive by a usual test probe (cantilever system). Therefore, in consideration of multiple touchdowns, an area of a length c in a longitudinal direction of the probing area 47 of about 60 μm and a length d in a short direction of the probing area 47 of about 35 μm is set as the arrangement inhibition area of the via 37.

FIG. 13B shows an example in which the probing area 47 provided in the pad electrode 46 is arranged inclinedly. Arrangement of the vias 37 for protection is inhibited also in the lower part of the probing area 47 of FIG. 13B similarly. As shown in FIG. 13B, the probing area 47 is provided inclined obliquely to a longitudinal direction of the pad electrode 46, i.e., to a longitudinal direction of the opening provided on the surface protective film 36. Thus, by providing the probing area 47 inclinedly, the longitudinal direction length c in the probing area 47 can be lengthened, and it is possible to increase a margin of the contact area of the test needle (probe) at the time of the wafer probing test.

FIG. 14A shows a modification of the pad electrode structure of FIG. 5. The via 37 in the pad electrode 4 of FIG. 14A is different from the via 37 provided in the pad electrode 4 of FIG. 5 in a respect of being provided in a slit-like shape whereas the via 37 of FIG. 5 is a so-called dot-shaped via whose cross section is substantially a cylindrical shape (substantially a conical shape). Moreover, although the vias 37 of FIG. 14B are slit-like vias similarly, a layout (arrangement) of the vias differs from that of FIG. 14A. In both FIG. 14A and FIG. 14B, like in FIG. 5, the cracks of the interlayer insulation film under the pad electrode 4 are prevented by providing the inhibition area in which arrangement of the via 37 for protection is inhibited in the pad electrode 4.

Since the contact area ratio by inter-metal connection of the metal layers 34, 39 and the via 37 can be enlarged by providing the via 37 for protection provided under the pad electrode 4 in a slit shape, as shown in FIG. 14A and FIG. 14B, it becomes possible to increase the adhesion strength of the pad electrode under the bonding ball.

FIG. 14C shows an example in which the vias 37 in the pad electrode 4 are provided in a latticed shape. Since the contact area ratio by inter-metal coupling of the metal layers 34, 39 and the via 37 can be further enlarged by providing the vias 37 in a latticed shape as in FIG. 14C, it is possible to increase the adhesion strength of the pad electrode under the bonding ball. Thereby, the via arrangement in an area other than the area sandwiched by the virtual circle of the diameter b inscribed in the rectangular opening formed in the surface protective film 36 on the pad electrode 4 and the virtual circle of the diameter a derived on the basis of a dimension of the wire diameter of the ball bonding, as shown in FIG. 14C, for example, in an area sandwiched by the virtual circle of the diameter b and the rectangular opening formed in the surface protective film 36, can also be inhibited. That is, even if the via 37 is arranged only in the area of the virtual circle of the diameter a and immediately under the bonding wire, the adhesion strength of the pad electrode under the bonding ball can be maintained sufficiently.

Third Example

A modification of the manufacturing method explained in FIG. 11A to FIG. 11J is explained using FIG. 15A to FIG. 15F. Incidentally, since a configuration of the element formation area 2 is the same as those of FIG. 11A to FIG. 11A, an explanation is given being limited to a manufacturing method for the pad electrode and its periphery.

Figure 15A:
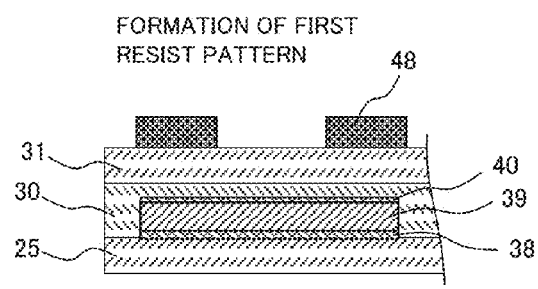
FIG. 15A is a sectional view showing a part of the manufacturing process according to the one embodiment of the present invention.

First, as shown in FIG. 15A, a first photoresist film 48 is applied onto the interlayer insulation film 31 that is on the metal layer 28 serving as a pad electrode of a lower layer and the barrier metals 27, 29, and a pattern that specifies the via inhibition area in which the vias are not arranged is formed by the photolithography technology, and is cured by UV (Ultraviolet) irradiation etc.

Figure 15B:
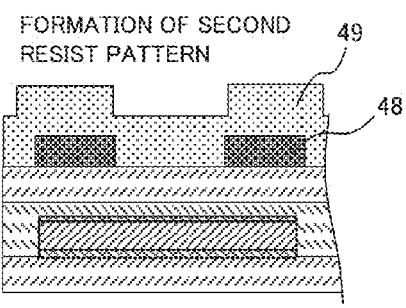
FIG. 15B is a sectional view showing a part of the manufacturing process according to the one embodiment of the present invention.

Next, as shown in FIG. 15B, a second photoresist film 49 is applied onto the first photoresist film 48 so as to cover the pattern of the via inhibition area formed with the first photoresist film 48.

Figure 15C:
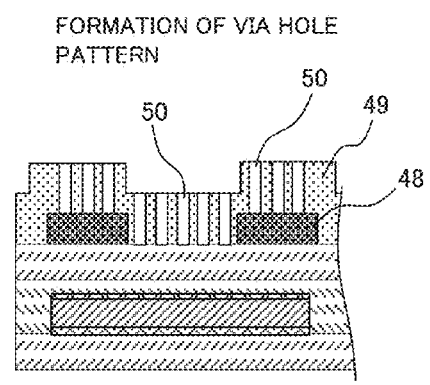
FIG. 15C is a sectional view showing a part of the manufacturing process according to the one embodiment of the present invention.

Subsequently, as shown in FIG. 15C, an opening hole pattern 50 is formed in the second photoresist film by the photolithography technology. Since the first photoresist film 48 has been cured at this time, the opening hole pattern 50 is not formed in the first photoresist film 48.

Figure 15D:
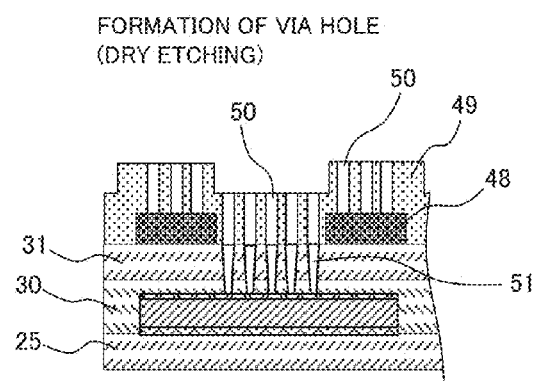
FIG. 15D is a sectional view showing a part of the manufacturing process according to the one embodiment of the present invention.

Then, as shown in FIG. 15D, an opening hole 51 is formed in the interlayer insulation films 30, 31 by the dry etching technology such as RIE.

Figure 15E:
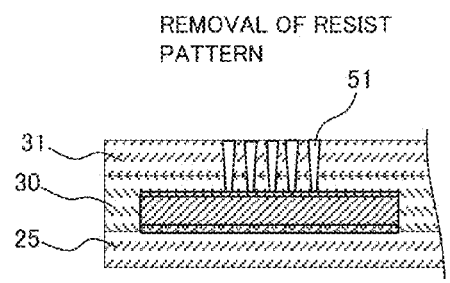
FIG. 15E is a sectional view showing a part of the manufacturing process according to the one embodiment of the present invention.

After this, as shown in FIG. 15E, the photoresist films 48, 49 are removed by asking with oxygen ($O_2$) plasma.

Figure 15F:
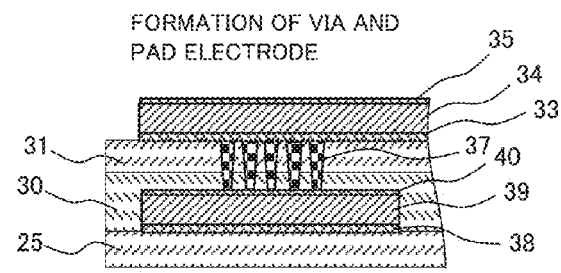
FIG. 15F is a sectional view showing a part of the manufacturing process according to the one embodiment of the present invention.

Finally, as shown in FIG. 15F, the inside of the opening hole 51 is embedded with the barrier metal and a high melting point metal such as tungsten (W), for example, via the barrier metal by the CVD method, and the embedded opening hole is flattened by the etch back technology of dry etching or the CMP technology to form the via 37. Subsequently, the metal layer 34 essentially consisting of aluminum (Al), the barrier metal 33 under it, and the barrier metal 35 over it are formed by the PVD method etc., and are patterned by the photolithography technology and the dry etching technology such as RIE to form the pad electrode that is a top layer. Then, the bonding pad (pad electrode) BP is completed through the same processes as those shown in FIG. 11H to FIG. 11J.

According to the method for manufacturing a bonding pad (pad electrode) of this example, in forming the via 37 for protection provided in the bonding pad (pad electrode), it is possible to specify a pattern of the via inhibition area by the first photoresist film 48 independently from formation of the opening hole pattern 51 in the second photoresist film 49. Therefore, an area sandwiched by the virtual circle of the diameter b shown in FIG. 5 and FIG. 6 and the virtual circle of the diameter a derived on the basis of the dimension of the wire diameter of the bonding ball can be set arbitrarily.

Thereby, an area in which the via arrangement is intended to be inhibited can be set more effectively based on, for example, failure analysis data etc.

In the above, although the invention made by the present inventors was concretely explained based on the embodiments, it goes without saying that the present invention is not limited to the embodiments and can be altered variously within a range that does not deviate from the gist of the present invention.

REFERENCE SIGNS LIST

LF - Lead frame,
MD - Mold,
SP - Semiconductor package,
SC - Semiconductor chip,
DP - Die pad, 1 - Semiconductor substrate,
2 - Element formation area,
3 - Periphery area,
BP, 4 - Pad electrode (Bonding pad),
5 - Silicon oxide film (Element isolation layer),
6 - Gate oxide,
7 - Diffusion layer,
8 - Polysilicon film,
9 - Tungsten silicide (WSi) film,
10, 11, 17, 18, 24, 25, 30, and 31 - Interlayer insulation film,
12, 19, and 51 - Opening hole,
14, 16, 21, 23, 27, 29, 33, 35, 38, and 40 - Barrier metal,
15, 22, 28, 34, and 39 - Metal layer,
13, 20, 26, 32, and 37 - Via,
36 - Surface protective film,
BW, 41 - Bonding wire,
42 - Bonding ball,
43 - Capillary,
44, 48, and 49 - Photoresist film,
45 - Pad opening,
47 - Probing area,
50 - Opening hole pattern.

What is claimed is:

1. A semiconductor device comprising:
a first pad electrode formed in an interlayer insulation film;
a second pad electrode formed in a layer higher than the first pad electrode; and
a via that is provided between the first pad electrode and the second pad electrode and electrically connects the first pad electrode and the second pad electrode,
wherein the via is not arranged under an area to which a capillary end of a wire bonder contacts, and
wherein the area is an area sandwiched by a virtual circle inscribed in an opening of a surface protective film over the second pad electrode and a virtual circle derived on the basis of a wire diameter of a bonding wire used in the wire bonding.

2. The semiconductor device according to claim 1, wherein the opening of the surface protective film has a rectangular shape.

3. The semiconductor device according to claim 2, wherein the virtual circle derived on the basis of the dimension of the wire diameter is a circle of a diameter that is larger than the wire diameter by x μm, where x is in a range of 5≤x≤13.

4. The semiconductor device according to claim 1, wherein the second pad electrode is covered with a surface protective film that has a rectangular opening over the second pad electrode, and the via is not arranged under an area in which a test needle contacts the second pad electrode at the time of a wafer probing test.

5. The semiconductor device according to claim 4, wherein the area in which the test needle contacts the second pad electrode at the time of the wafer probing test is provided inclined to a longitudinal direction of the opening.

6. The semiconductor device according to claim 1, wherein the via is one of a dot-shaped via, a slit-like via, or a latticed via.

7. A semiconductor device comprising:
a first pad electrode;
a second pad that is formed in a layer higher than the first electrode and is electrically connected with the first pad electrode through a via; and
a lead frame electrically connected with the second pad electrode through bonding wire,
wherein under a capillary mark in a junction of the bonding wire and the second pad electrode, the via is not arranged.

8. The semiconductor device according to claim 7, wherein the capillary mark is a dent of a chamfer part of a capillary that is formed on a bonding ball at the time of the wire bonding.

9. The semiconductor device according to claim 7, wherein the second pad electrode is covered with a surface protective film having a rectangular opening over the second pad electrode, and the via is not arranged in an area that is sandwiched between a virtual circle inscribed in the opening and a virtual circle derived on the basis of a dimension of a wire diameter of the bonding wire used in the wire bonding.

10. The semiconductor device according to claim 9, wherein the virtual circle derived on the basis of the dimension of the wire diameter is a circle of a diameter that is larger than the wire diameter by x μm, where x is in a range of 5≤x≤13.

11. The semiconductor device according to claim 7, wherein the second pad electrode is covered with a surface protective film that has a rectangular opening over the second pad electrode, and the via is not arranged under an area in which the test needle contacts the second pad electrode at the time of a wafer probing test.

12. The semiconductor device according to claim 11, wherein the area in which the test needle contacts the second pad electrode at the time of the wafer probing test is provided inclined to a longitudinal direction of the opening.

13. The semiconductor device according to claim 7, wherein the via is one of a dot-shaped via, a slit-like via, or a latticed via.

14. The semiconductor device according to claim 1, wherein at least one transistor is formed under the first pad electrode.

* * * * *